United States Patent

Ramsey et al.

[11] Patent Number: 5,455,195
[45] Date of Patent: Oct. 3, 1995

[54] METHOD FOR OBTAINING METALLURGICAL STABILITY IN INTEGRATED CIRCUIT CONDUCTIVE BONDS

[75] Inventors: Thomas H. Ramsey, Rowlett; Rafael C. Alfaro, Carrollton, both of Tex.

[73] Assignee: Texas Unstruments Incorporated, Dallas, Tex.

[21] Appl. No.: 238,995

[22] Filed: May 6, 1994

[51] Int. Cl.⁶ .................................................. H01L 21/44
[52] U.S. Cl. ........................ 437/183; 437/200; 437/201; 257/737; 257/766; 257/780; 228/4.5; 228/904
[58] Field of Search .................................... 437/183, 201, 437/200; 257/766, 737, 780; 228/4.5, 904

[56] References Cited

U.S. PATENT DOCUMENTS

| | | | |
|---|---|---|---|
| 3,465,211 | 9/1969 | Adams | 257/766 |
| 3,585,461 | 6/1971 | Eynon et al. | 437/192 |
| 3,599,060 | 8/1971 | Triggs et al. | 317/234 R |
| 3,617,818 | 11/1971 | Fuller et al. | 437/192 |
| 3,839,780 | 10/1974 | Freedman et al. | 228/249 |
| 4,176,443 | 12/1979 | Iannuzzi et al. | 437/192 |
| 4,517,252 | 5/1985 | Hugh | 428/553 |
| 4,717,066 | 1/1988 | Goldenburg et al. | 228/4.5 |
| 4,970,571 | 11/1990 | Yamakawa et al. | 257/737 |
| 5,028,454 | 7/1991 | Lytle et al. | 427/123 |
| 5,206,186 | 4/1993 | Neugebauer et al. | 437/183 |
| 5,260,234 | 11/1993 | Long | 437/203 |
| 5,302,550 | 4/1994 | Hirota et al. | 437/183 |
| 5,376,584 | 12/1994 | Agarwata | 437/183 |

FOREIGN PATENT DOCUMENTS

| | | | |
|---|---|---|---|
| 0271110 | 10/1987 | European Pat. Off. | 257/766 |
| 53-14557 | 2/1978 | Japan | 257/766 |
| 0111760 | 9/1979 | Japan | 437/183 |
| 0106140 | 7/1982 | Japan | 437/192 |
| 0029139 | 2/1986 | Japan | 437/192 |
| 0081344 | 3/1989 | Japan | 437/183 |
| 2191334 | 7/1990 | Japan | 257/780 |
| 2296336 | 12/1990 | Japan . | |
| 0208355 | 9/1991 | Japan | 437/196 |
| 6176903 | 6/1994 | Japan | 437/196 |

Primary Examiner—Clik Chaudhuri
Assistant Examiner—Long Pham
Attorney, Agent, or Firm—Robby T. Holland; Wade James Brady, II; Richard L. Donaldson

[57] ABSTRACT

A method for electrically connecting integrated circuit copper-gold ball bond that connect a bond wire (18) with a bond pad (14) forms a palladium layer (16) in the electrical connection between the bond wire (18) and the bond pad (14). The connection avoids excessive stresses that arise from intermetallic formations between the bond wire (18) and the bond pad (14).

5 Claims, 1 Drawing Sheet

METHOD FOR OBTAINING METALLURGICAL STABILITY IN INTEGRATED CIRCUIT CONDUCTIVE BONDS

TECHNICAL FIELD OF THE INVENTION

The present invention relates in general to integrated circuits and, more particularly, to a method for obtaining metallurgical stability in integrated circuit conductive bonds that eliminates or minimizes phase or intermetallic formations and, thereby, eliminates excessive stresses that exist between gold or copper wires and the electrically connected aluminum bond pads.

BACKGROUND OF THE INVENTION

The typical bond that exist between integrated circuit gold or copper bond wires and aluminum bond pads often grows intermetallic compounds such as $Au_5Al_2$ or $AuAl_2$. These compounds create strong bonds at the interface of the aluminum substrate (i.e., at the $SiO_2$ level and CiW interconnects) structure. These strong bonds, however, also possess certain characteristics that make them less desirable from a reliability stand point. For example, the intermetallic compounds are brittle and create stress that is detrimental to the mechanical strength of the bond. Added stresses in the structure due to various intermetallic compounds accelerate failure or, equivalently, reduce the lifetime of the associated integrated circuit due to the bond wire lifting when the circuit is subjected to further stress such as temperature cycling or pressure changes.

SUMMARY OF THE INVENTION

There is a need, therefore, for a reliable method of bonding gold or copper bond wires to aluminum bond pads that avoids the formation of brittle intermetallics between the gold or copper wires and the associated aluminum bond pads.

There is a need for an improved bonding method that eliminates the detrimental stresses that occur in existing bond devices.

There is a further need for an improved method for bonding gold or copper wire to aluminum bond pads that does not accelerate failure or bond lifting as a result of intermetallic compounds that form between the gold or copper wire and the aluminum pads.

The present invention, accordingly, provides an improved method for reliably bonding gold or copper wire to aluminum bond pads that possesses improved metallurgical stability and that eliminates or minimizes phase transformations at the aluminum bond pad instead of forming intermetallics. Consequently, the present invention avoids excessive stresses and radical structure formation at the aluminum bond pads to overcome or substantially reduce limitations associated with known methods of bonding gold or copper wires to aluminum bond pads for use in integrated circuits. The present invention includes the step of depositing a thin layer of palladium over the normal aluminum bond pad to form a solid solution series of gold-palladium or copper-palladium that has increased metallurgical stability over time.

According to one aspect of the invention, there is provided a method for electrically associating a gold or copper bond wire with an aluminum bond pad that includes the steps of forming a palladium layer on the bond pad. The next step is to connect the gold or copper bond wire with the palladium layer to form the desired electrical connection between the gold or copper bond wire and the aluminum bond pad.

A technical advantage of the present invention is that the process makes a bond from the gold or copper ball to the pad that is coated with a layer of palladium between 1 and 2.5 microns thick. During heating or temperature processing the palladium does not produce intermetallics with either the bond wire or the bond pad. Consequently, no stress occurs on the wire bond interface. This extends the life of the integrated circuit in many instances.

A further technical advantage of the present invention is that the gold-palladium and copper-palladium systems that result from the layer of palladium form solid solution series that change very little with increases in temperature and pressure. As a result, the present invention provides increased metallurgical stability for the integrated circuit electrical connection.

BRIEF DESCRIPTION OF THE DRAWINGS

The invention and its modes of use and advantages are best understood by reference to the following description of illustrative embodiments when read in conjunction with the accompanying drawings, wherein.

DETAILED DESCRIPTION OF THE ILLUSTRATIVE EMBODIMENT

The illustrative embodiments of the present invention are best understood by referring to the FIGUREs, wherein like numerals are used for like and corresponding parts of the various components.

In order to prevent growth of gold-aluminum or copper-aluminum intermetallics, the present embodiment forms a barrier layer of material such as palladium between the bonding wire and bond pad. This makes an electrical connection between the gold or copper bond wire to the aluminum bond pad, but without a physical connection between the two points. The layer of palladium may be, for example, between 1 and 2.5 microns thick. The advantage of the palladium layer is that during heating or any temperature processing or high bonding circuitry use, no intermetallics form. The gold-palladium and copper-palladium systems that may result are solid-solution series and change uniformly with increases in temperature and the diffusion of one metal into the other. This eliminates the stresses that conventional bonds experience at the wire-bond pad interface.

Figure 1:
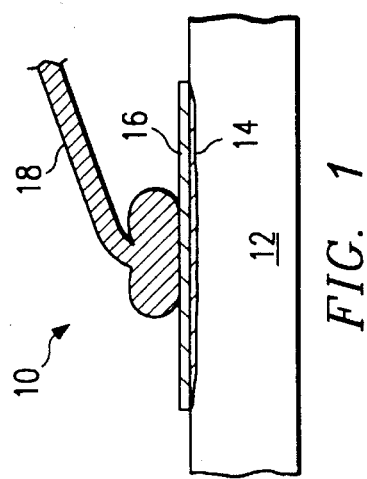
FIG. 1 shows a conceptual side view of a bonding wire-bond pad configuration that is formed according to the present embodiment.

FIG. 1, accordingly, shows bonding system 10 to include bond pad 14 on substrate 12. On bond pad 14 is palladium layer 16. Palladium layer 16 connects both to bond wire 18 and bond pad 14. Bond wire 18 may be, for example, either a copper ball bond wire or a gold ball bond wire.

Figure 2:
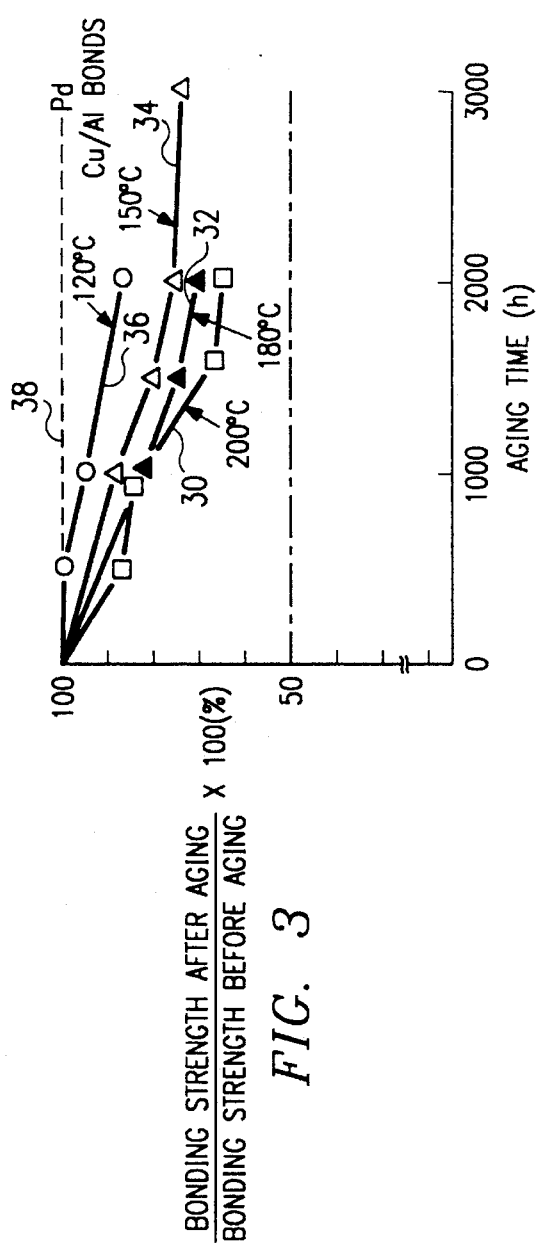
FIGS. 2 and 3 demonstrate the effect of aging temperature and time on the degradation behavior of gold-aluminum electrical bonds and copper-aluminum electrical bonds formed with and without the present embodiment of the invention.
Figure 3:
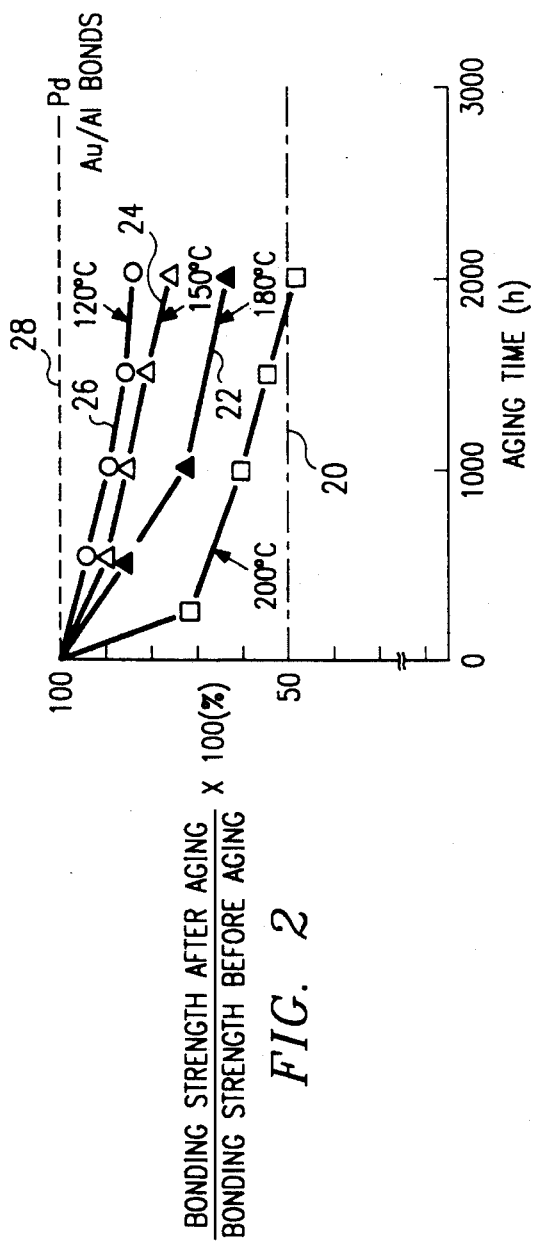

FIGS. 2 and 3 show the effects of aging temperature and time on degradation behavior of gold-aluminum ball bonds and copper-aluminum ball bonds, respectively. In FIG. 2, for example, a vertical axis is a percentage ranging from 0 to 100% determined by the formula of dividing bonding strength after aging by bonding strength before aging and multiplying this result times 100. The horizontal axis ranges from 1000 to 3000 to indicate the number of hours after bond formation that bonding strength is tested. Thus, in FIG. 2 for gold-aluminum bonds line 20 shows that at an aging temperature of 200° C., a gold-aluminum ball bond degrades significantly within the first 1000 hours and continues to degrade to below 50% by the 2000 hour point. Line 22 shows the degradation that occurs at a constant aging temperature of 180° C. Line 24 shows degradation at a constant aging temperature of 150° C. Line 26 shows degradation at a 120° C. The bonding strength percentage relative to aging, therefore, degrades for the conventional gold-aluminum ball bond. In FIG. 2, however, line 28 shows that for aging temperatures of 200° C. and below to room temperature, because no intermetallics form and no brittleness arises in the bond wire-bond pad connection by virtue of the palladium layer 16, the bonding strength ratio remains constant over time.

A similar result obtains for the copper-aluminum ball bond as FIG. 3 illustrates. Thus, line 30 shows the effects of a 200° C. aging temperature causing a degradation in the bond strength of the connection. Line 32 illustrates the effect of 180° C. aging temperature. Line 34 illustrates the effect of 150° C. aging temperature. Line 36 shows the effect of a 210° C. aging temperature. As this is the case with the gold-aluminum ball bonds, line 38 shows that for all of the temperatures stated above, there is no similar degradation in the ball bond strength after aging for the bond that includes the palladium layer.

Overall results indicate that with the present embodiment an optimum bond temperature is 260° C. This may change, however, in implementation in view of considerations such as environmental testing and other parameters. The copper wire on aluminum bond pad, for example, at 300° C., the bond strength initially rises from "as bonded" to a 5 hour processing bake at 175° C. That is, as bonded, the bond strength is 56.6 grams shear. After five hours at 175° C., the strength increases to 50.5 grams shear. At 15 and 24 hours, respectively, the ball bond strength reduces to 52.1 grams shear and 42.7 grams shear in a 175° C. aging environment. This is due to the formation of $CuAl_2$ and CuAl and their associated stresses. However, if palladium layer 16 is formed to a thickness of between 1000 and 5000 Å, for example, over aluminum bond pad 14, then the shear strength becomes stable. This is because a solid solution forms between the copper bonding wire and the palladium or, alternatively, the gold bonding wire and the palladium. As a result of the solid solution, no intermetallic phase forms that would create a highly stressed bond interface. As much as 90 grams shear has been reported due to the gold-aluminum phase transformation in some instances. These stresses, particularly at the periphery of large ball bonds that may exist in molded plastic packages, increase the total stress and may create bond lifts that cause intermetallic separation and failure. Shear strength data for copper and palladium indicate the stability of the sold-solution bond structure. Thus, for example, the bond temperature of 300° C. with 1000 Å of copper and 5000 Å of palladium produce an as-bonded strength of 58 grams shear. After six hours at 200° C. the as bonded strength was 52 grams shear. After six hours at 200° C., the bond strength increased to 55 grams shear at temperature of 275° C.

The structure of FIG. 1 may be formed by a wide variety of deposition or sputtering techniques that can result in palladium layer 16. There may be other materials suitable for serving the function of palladium layer 16. For example, chromium may be used to form a layer having thickness, for example, of 1000 Å. With this thickness, similar bond strength results occur.

A technical advantage of the present invention is that during heating or temperature processing palladium layer 16 does not produce intermetallics either with bond pad 14 or bond wire 18. Consequently, no stress results on the wire-bond interface. This extends the life of the integrated circuit in many instances.

Another technical advantage of the present invention is that the gold-palladium and copper-palladium systems that result from the layer of palladium form solid solution series that change very little with increases in temperature and pressure. As a result, the present invention provides increased metallurgical stability for the integrated circuit bond pads.

In summary, the present embodiment provides a method for electrically associating a bonding wire with a bond pad and includes the steps of forming a palladium layer on the bond pad. A next step is to connect the ball bond wire with the palladium wire to form an electrical connection between the bond pad and the bond wire. The bond wire may be gold bond wire or copper bond wire or other type of metal that forms intermetallics with common bond pad materials such as aluminum.

ALTERNATIVE EMBODIMENTS

There are any number of alternatives or changes in the design of the method and structure described herein for achieving metallurgical stability in integrated circuit copper-gold ball bonds which may be readily apparent to one of ordinary skill in the art. Such alternatives may not be employed in the above embodiments for any number of reasons, such as cost and performance considerations, size constraints, availability of materials, arbitrary design decisions and the like. A number of these alternatives have been mentioned above. These alternatives, however, are mentioned without limitation of the other embodiments which may be equally obvious to one of ordinary skill in the art, but are not mentioned here because of time and space constraints. Thus, the invention is intended to be limited only by the claims which are meant to cover such obvious alternatives and deviations from the desired design.

What is claimed is:

1. A method for electrically associating a ball bond wire with an aluminum pad, comprising the steps of:

forming a palladium layer on an aluminum bond pad; and connecting the aluminum ball bond wire with the palladium layer to electrically connect the bond pad with the bond wire.

2. The method of claim 1, further comprising the step of forming the palladium layer to a thickness of between 1000 and 5000 Å.

3. The method of claim 1, wherein said connecting step comprises the step of connecting a gold ball bond wire with the palladium layer to electrically connect a gold ball bond wire to the aluminum bond pad.

4. The method of claim 1, wherein said connecting step comprises the step of connecting a copper ball bond wire with the palladium layer to form an electrical connection between the top of ball bond wire and the aluminum bond pad.

5. A method for electrically associating a ball bond wire with an aluminum bond pad, comprising the steps of:

forming a chromium layer on an aluminum bond pad; and connecting the aluminum ball bond wire with the chromium to electrically connect the bond pad with the ball bond wire.

\* \* \* \* \*

UNITED STATES PATENT AND TRADEMARK OFFICE
CERTIFICATE OF CORRECTION

PATENT NO.    : 5,455,195
DATED         : October 3, 1995
INVENTOR(S)   : Thomas H. Ramsey and Rafael C. Alfaro It is certified that error appears in the above-identified patent and that said Letters Patent is hereby corrected as shown below:

<u>Title page,</u>
Item [73], Assignee, the assignee should be -- Texas Instruments Incorporated --.

<u>Column 4,</u>
Line 56, delete "aluminum";
Line 57, between "the" and "bond" insert -- aluminum --.

<u>Column 6,</u>
Line 2, delete "aluminum";
Line 3, between "the" and "bond" insert -- aluminum --.

Signed and Sealed this

Tenth Day of June, 2003

JAMES E. ROGAN
*Director of the United States Patent and Trademark Office*